United States Patent
Gasquez

[11] Patent Number: 6,131,510
[45] Date of Patent: Oct. 17, 2000

[54] SILK-SCREEN SCRAPING BLADES FOR INHIBITING OVERFLOW OF PRINTING INK

[75] Inventor: Edouard Gasquez, Le Mans, France

[73] Assignee: U.S. Philips Corporation, New York, N.Y.

[21] Appl. No.: 09/190,667

[22] Filed: Nov. 12, 1998

[30] Foreign Application Priority Data

Nov. 13, 1997 [FR] France .................................. 97 14247

[51] Int. Cl.⁷ .............................................. B41F 15/42
[52] U.S. Cl. ......................................... 101/123; 101/114
[58] Field of Search ............................. 101/123, 126, 101/129, 114

[56] References Cited

FOREIGN PATENT DOCUMENTS

| 0626259A1 | 11/1994 | European Pat. Off. . |
| 63-154350 | 6/1988 | Japan . |
| 5-77393 | 3/1993 | Japan . |
| 5-200976 | 8/1993 | Japan . |
| 06039999A | 2/1994 | Japan . |
| 8-207243 | 8/1996 | Japan . |

*Primary Examiner*—John S. Hilten
*Assistant Examiner*—Daniel J. Colilla
*Attorney, Agent, or Firm*—Steven R. Biren

[57] ABSTRACT

The system comprises two oppositely working scraping blades (8, 9) fixed to a blade support (6, 7) for depositing a silk-screen printing product (18) via a screen (17) on a support (21) to be coated. According to the invention, each extremity of the blade support comprises means (28, 29) for fixing a cheek for confinement of the product. The cheek (24, 25) is a plate of flexible material which engages the screen (17) by means of its free edge, with a small spacing being saved between the blade and the plate. The plate is oriented in such a way that the silk-screen printing product (26, 27), which passes beyond the extremity of the blade during its passage under pressure on the screen, is brought back to within the screen in the work zone of the blade.

8 Claims, 3 Drawing Sheets

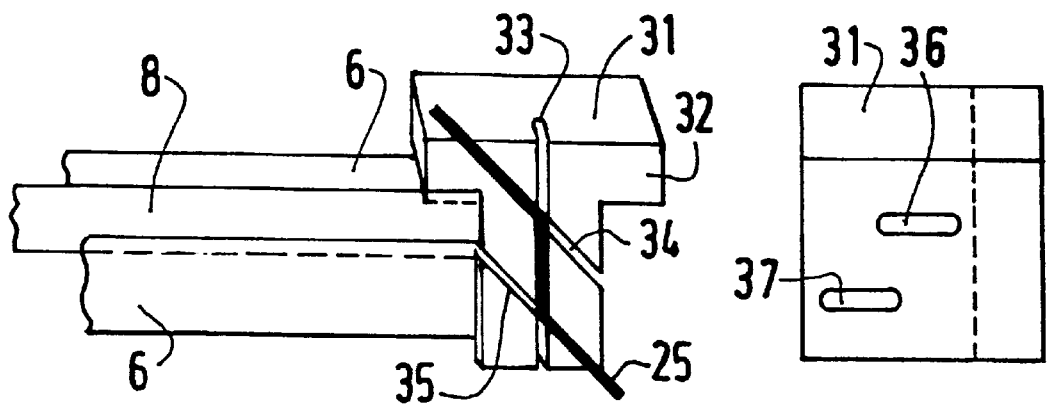
FIG. 3B    FIG. 3A
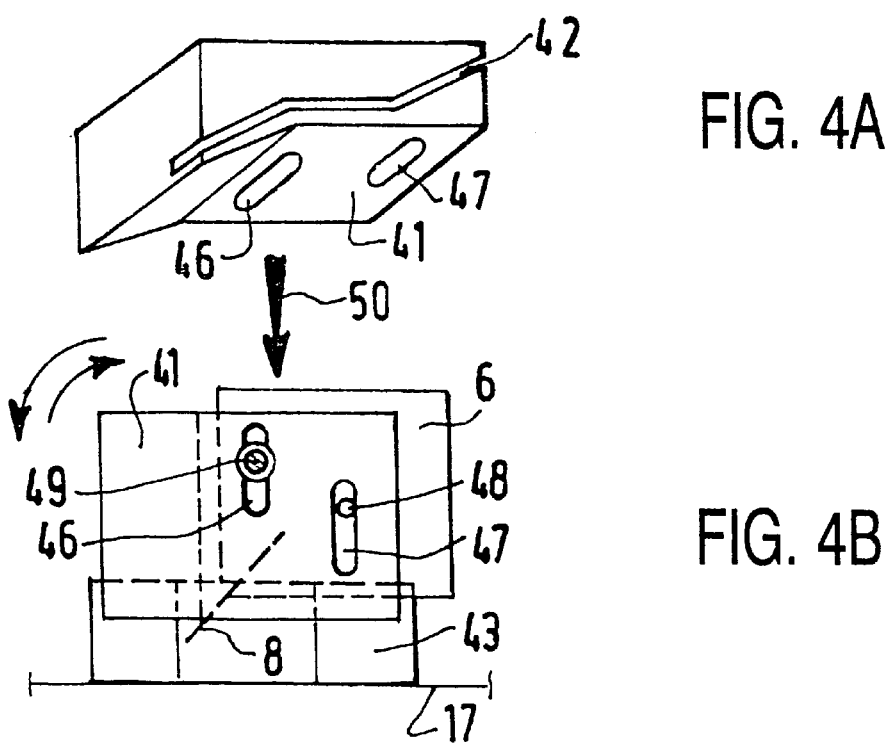
FIG. 4A
FIG. 4B

SILK-SCREEN SCRAPING BLADES FOR INHIBITING OVERFLOW OF PRINTING INK

BACKGROUND OF THE INVENTION

The invention relates to an automatic silk-screen printing system having two oppositely working scraping blades which are each fixed to a blade support for depositing a silk-screen printing product in accordance with a given configuration on a support to be coated via a screen to be positioned on said support, said screen being perforated in accordance with said configuration.

The invention is applicable to the silk-screen printing technique in general, and more particularly to the technique which consists of depositing a soldering paste on contact areas of a printed circuit board or a ceramic board for subsequent soldering of the components in accordance with a melting process which is akin to braze-welding, a technique particularly adapted to surface-mounted components. In this particular preferred application, the soldering paste which constitutes the silk-screen printing product is constituted, for example by pellets of a Pb-Sn alloy having a diameter of several microns and agglomerated by means of a binder giving this paste thixotropic qualities. The screen is made of a thin leaf of stainless steel of 180 $\mu$m or 150 $\mu$m, provided with cavities arranged above the contact areas on the printed circuit board or the ceramic board to be coated.

To automate the process, two blades working in opposition are used. Each blade of flexible steel is fixed to a support and the two supports of the blade are firmly tightened by means of a clamp so that the blades enclose a mutual angle of the order of 90 degrees and an angle of approximately 45 degrees with respect to the screen. The clamp itself forms part of a carriage with respect to which it can move approximately 10 degrees to the one or the other side of a median position in which the blades substantially constitute the same angle with respect to the screen. Moreover, a vertical translation movement of the clamp with respect to the carriage allows the one or the other blade to engage the screen with a certain nominal predetermined pressure, after which the horizontal translation movement with which the silk-screen printing operation is carried out is effected on a support to be coated, such as a printed circuit board. At the end of the process, the clamp is raised and an unused soldering paste is left on the screen by the blade which was in action and subsequently the clamp performs a tilting movement so as to raise again the first blade which was in action and to lower it to a level which is smaller than that of the first blade which was raised and inactive during the preceding passage of the carriage. The clamp is subsequently lowered until the second blade engages the screen with said predetermined pressure, while the translation movement of the carriage restarts in a direction reverse to the previous direction and the solder paste left by the first blade is taken up upon the passage by the second blade, and a new support (printed circuit board) is coated. When the horizontal course of the carriage ends, the same operations of raising, tilting and lowering start again symmetrically, while the two blades are interchanged and the cycle recommences. During these operations some of the silk-screen printing product (which will hereinafter be referred to more generally as cream so as to designate either an ink or a paste) is used up by the product to be coated and, at each passage of the carriage, a part laterally brims over on the screen at the two extremities of the blade. Consequently, extra cream must be periodically added on the screen between the two blades after a certain number of blade passages.

Such a system has the drawback that the cream which has brimmed over at the extremities of the blades forms a bead which is not always taken up by the blades, which bead thickens and progressively dries up. Under these conditions it is impossible to control the quantities of the product (cream) which are effectively used and the lost quantities of the product. The cream which is involuntarily evacuated on the sides loses its qualities of viscosity due to evaporation of the solvents and the binders which it contains; after a delay which is short enough to correspond to approximately twenty passages of the blades, this cream is definitively unusable. In the prior art, this displacement of the cream towards the working zone requires a frequent manual intervention to rearrange the product which has brimmed over, which is not very satisfactory for an automatic system.

Another drawback of the prior art mentioned above is that the use of a system of automatically supplying the silk-screen printing cream is risky because the cream which has become unusable is not easily taken into account because it is difficult to value its proportion with respect to the quantity which has been really used.

To alleviate this drawback, it is known, particularly from patent application EP-0 626 259 to associate leakage-preventing stop devices with the lateral extremities of the scraping blade(s). However, the latter are oriented parallel to the displacement direction of the blades and the lateral overflow of the cream is not completely avoided, but only slowed down.

SUMMARY OF THE INVENTION

It is an object of the invention to inhibit the irreversible overflow of the cream beyond the lateral edges of the scraping blades in an automatic silk-screen printing system.

To this end, the drawbacks of the prior art are inhibited or obviated by a silk-screen printing system of the type described in the opening paragraph, which is characterized in that each extremity of the blade support comprises means for fixing a cheek for the silk-screen printing product, said cheek consisting of a plate of flexible material which, in operation, engages said screen with its free edge, with a small spacing being saved between the lateral edge of the scraping blade and the plate, the latter being oriented so as to bring the silk-screen printing product, which passes beyond the extremity of the blade during its passage under pressure on the screen, back to within the screen in the work zone of the blade.

The basic idea of the invention is that, while leaving a rim of cream to form at each extremity of the blade during a passage on the screen, this rim is taken up during passage of the next blade. Thus, at each passage of the blade, the cream of the rim is remixed with the cream which has not yet brimmed over during the previous passage, and the lateral rim substantially retains the same minimal thickness from one passage of the blade to the next passage. The quantity of cream which constitutes the lateral rim may be considered to be negligible and it will become possible to adjust the extra quantity of cream to be periodically added automatically between the two blades after a number of passages of the predetermined blade, given the fact that the quantity used up by the support to be coated at each passage is precisely known. The system can thus operate uninterruptedly for hours and even tens of hours without a loss of time nor of products to be silk-screen printed.

A preferred embodiment of the invention is characterized in that said fixation means consist, for each plate constituting a cheek, of a cheek support having a groove in which said plate is inserted with a slight grip, said cheek support being fixed by means of screwing to said extremity of the blade support.

As will be explained hereinafter, each cheek must be mounted with care because the free edge which engages the screen must be perfectly horizontal in connection with the precise angle enclosed by the scraping blade with the screen and the force of engagement of this free edge must be strong enough to guide and recenter all the cream which comes into contact with it but is simultaneously weak enough so as not to reduce the pressure too much that the extremity of the blade must exert to take along all the cream which comes into contact with it during its movements.

Another preferred embodiment of the invention is characterized in that said fixation means consist, for each plate constituting a cheek, of screws associated with washers for directly screwing said plate to said extremity of the blade support.

In this embodiment, which is simpler than the previous embodiment, it may prove to be useful to preform each plate by preheating of a plane plate made of polyvinyl chloride (PVC) e.g. and subsequent twisting or bending in accordance with a desired predetermined profile.

An advantageous improvement of the invention is characterized in that the free edge of each plate is chamfered from the outside to the inside of the system, such that only a ridge situated along the internal face of the plate is in contact with the screen during operation.

When a light force is thus exerted on the free edge of the cheek, the ridge which is only in contact with the screen is lightly pushed back towards the interior of the system and it is against the ridge that all the above-mentioned force is exerted, which two characteristic features are favorable for satisfactorily scraping the excess cream with shearing and guidance as far as behind the blade.

The invention is preferably applicable to an automatic silk-screen printing system intended to deposit a soldering paste on contact areas of a printed circuit board, in which the screen is constituted by a thin leaf of stainless steel provided with cavities arranged above said contact areas.

These and other aspects of the invention are apparent from and will be elucidated with reference to the embodiments described hereinafter.

BRIEF DESCRIPTION OF THE DRAWINGS

FIGS. 3A and 3B illustrate a first embodiment of the invention, FIG. 3A being a side view of the fixation means for a cheek and FIG. 3B being a perspective bottom view, partly broken away, of a cheek mounted on a blade support.

FIGS. 4A and 4B illustrate a second embodiment of the invention, FIG. 4A being a perspective view of the fixation means and FIG. 4B being an end view of a mounted cheek.

DESCRIPTION OF THE PREFERRED EMBODIMENT

Figure 1:
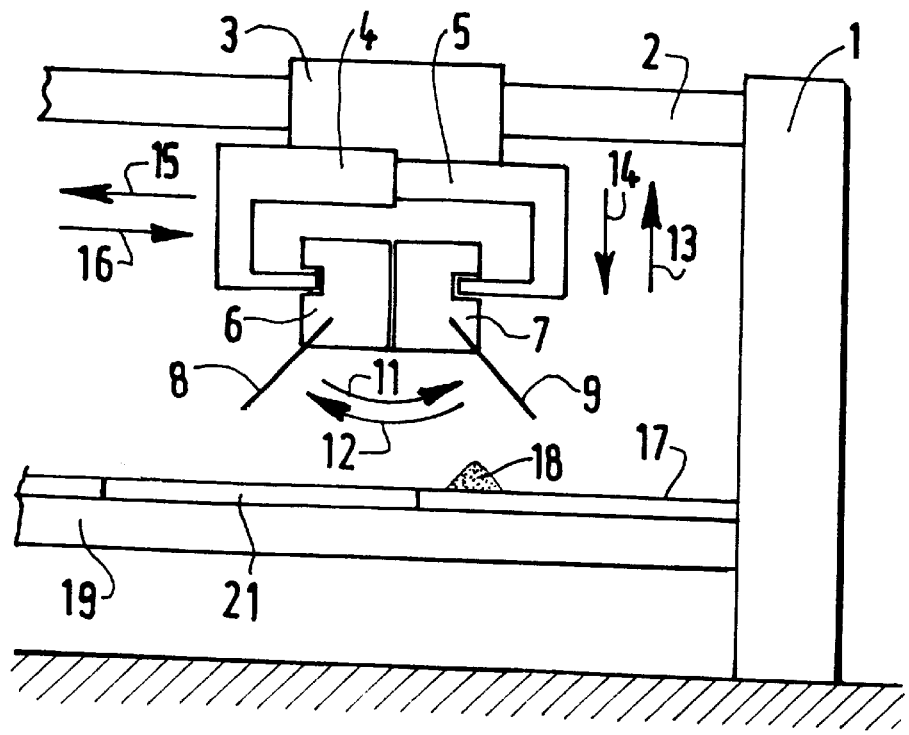
FIG. 1 shows diagrammatically, and partly broken away, an automatic silk-screen printing system with two oppositely working scraping blades.

The automatic silk-screen printing system shown in FIG. 1 is constituted by a porch comprising two vertical pillars such as 1 (the left pillar is not shown) and a horizontal beam 2 which serves as a support and guidance rail for a carriage 3. The carriage 3 itself supports a clamp whose jaws 4, 5 are designed to firmly clamp together two supports 6, 7 for scraping blades 8, 9 respectively. The assembly, which may be considered as being undeformable in the clamping state, and which is constituted by the elements 4 to 9 may be subjected, with respect to the carriage 3, to rotational movements in the two directions indicated by the arrows 11 and 12 in accordance with sectors ranging up to several tens of degrees. This assembly may also be displaced in accordance with a vertical translation movement upwards or downwards, as indicated by the arrows 13 and 14. Known mechanical means allow the afore-mentioned displacement between the carriage and the clamp. Moreover, the carriage 3 may be subjected to a horizontal translation along the beam 2 in the two directions indicated by the arrows 15 and 16.

In FIG. 1, the system is shown in a raised and neutral position, with each scraping blade supported by a blade support enclosing an angle of approximately 45 degrees with respect to a horizontal plane.

The silk-screen printing system shown in FIG. 1 also comprises a screen 17 on which a rim of cream or paste 18 to be silk-screen printed is provided, and a table 19 carries a plane support 21 which is clamped between the table 19 and the screen 17 which is flat and serves as a stencil for the silk-screen printing operation to be performed on the support 21.

FIG. 1 is diagrammatic and, in practice, a crossbar (not shown) associated with the carriage 3 serves as a support for hooking up and correctly positioning the blade supports 6 and 7 before they are tightened by the clamp 4, 5.

Starting from the position shown in FIG. 1, the system operates as follows:

A slight tilting of the clamp 4, 5 in the direction of the arrow 12 lowers the blade 9 while raising the blade 8.

The assembly of elements 4 to 9 is subsequently lowered into the direction of the screen (arrow 14) until the free edge of the blade 9 engages the screen 17 with a predetermined pressure.

Subsequently, the assembly of elements 3 to 9 is moved to the left in the direction of the arrow 15. In this movement, the rim of cream 18 is taken along by the blade 9 which squeezes the cream against the screen 17.

Figures 2A, 2B:
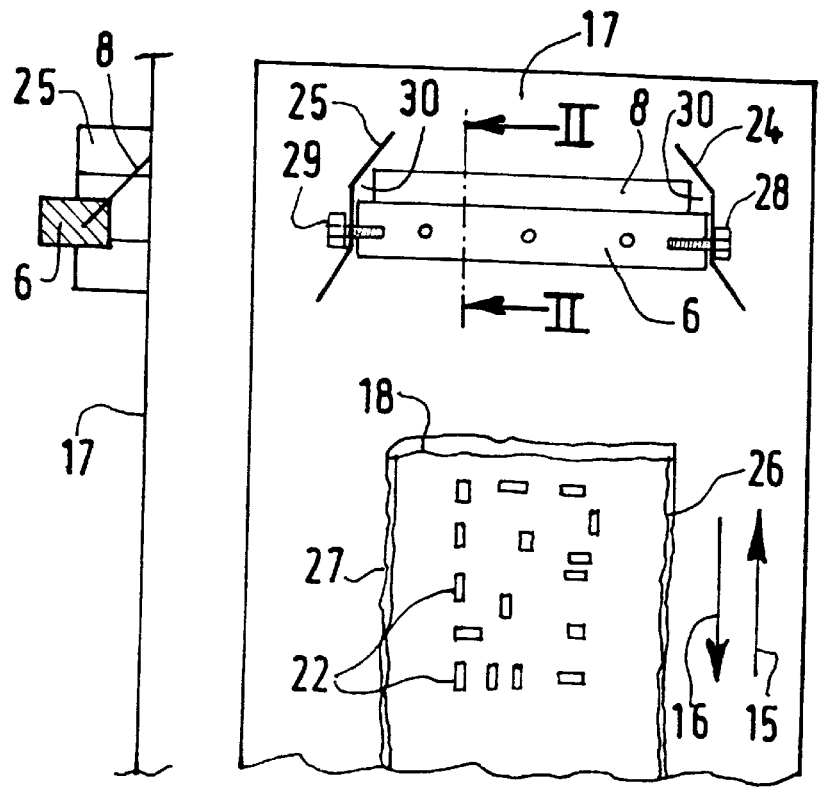
FIGS. 2A and 2B show, partly broken away, a part of the silk-screen printing system according to the invention in a plan view at 2A and in a view from the right at 2B.

During passage on the support 21 to be coated, a part of the cream is pushed back through apertures (not visible) of the screen against predetermined locations of the support 21 in accordance with a cavity configuration shown at 22 in FIG. 2A. The assembly 3 to 9 stops, at the left of the Figure, at an abscissa where the blade 9 has passed beyond the left extremity of the support 21.

The assembly 4 to 9 is raised, which leaves a rim of cream on the screen 17, subsequently the assembly 4 to 9 is tilted in the direction of the arrow 11 as far as a position where the blade 8 is lower than the blade 9, and a new support replaces the support 21 and the movement of the system is repeated symmetrically with the previous movement: lowering in accordance with the arrow 14 and translation in accordance with the arrow 16.

Thereafter, the cycle recommences for coating the two new supports such as 21.

At each passage above a support to be coated, a small part of the cream 18 is used via the cavities, and the rim, diminishing in volume, is elongated along one blade (8) and then along the other blade (9). After a small number of passages, the rim will pass beyond the edges of the blades and will create lateral rims parallel to the direction of displacement of the system (arrows 15 and 16). These rims, which are not shown in FIG. 1, constitute parts of the product which will be lost and whose proportion with respect to the useful product deposited on the supports such as 21 is difficult to evaluate and control. Indeed, this cream, which is not again taken up by the blades, dries up and must be removed and discarded after a small number of passages of the scraping blades (approximately 15 to 20 passages). This involves a frequent manual intervention, a loss of cream and leads to a risky use of a system for automatically supplying the cream for silk-screen printing because the cream thus rendered unusable is not taken into account.

The plan view in FIG. 2 allows elucidation of the invention. In order not to complicate the drawing, a single support, 6, provided with its blade 8 is shown above the screen 17 which is perforated in accordance with the configuration of cavities 22. A cheek for confining the cream such as 24, 25 is fixed to each extremity of the support 6.

These cheeks are positioned with respect to the scraping blade 8 (and 9, respectively) in such a way that when the blade 8 is pressed on the screen 17 at an angle and with a given force, their free edge engages the screen 17 all along its length with a slight pressure, which is visible in the sectional view of FIG. 2B. In the view from above, the cheeks are widened from back to front with respect to the direction of displacement of the blade which they enclose, i.e. the direction 16 in FIG. 2A. This means that during passage under pressure of the blade 8 on the screen, the cream which brims over at each extremity is brought back to within the screen in the work zone of the blade. To this end, a small spacing 30 is saved between each extremity of the blade and the interior wall of the corresponding cheek, this spacing preferably being of the order of several millimeters and typically between 1 and 10 mm. The result of this operation is visible in FIG. 2A: during the previous passage of the blade 9 (not shown), the main rim of the cream 18 has been brought beyond the configuration of holes (cavities) 22 and occupies the position shown, after raising of the blade 9. Simultaneously, two narrow rims of cream 26 and 27 have formed laterally as a consequence of the fact that the cream has brimmed over from the sides of the blade 9 and has been centered in the work zone of the blades for this cream, at the back of the blade 9, by the cheeks (not shown) such as 24 and 25. It is indeed clear that during the next passage of the blade 8 in accordance with the direction 16, the lateral rims 26 and 27 are taken up again by the blade 8 for the same reason as the main rim 18. The overall amount of cream available on the screen 17 is thus mixed at each passage of the blade on the screen, this mixture being obtained between the cream of the main rim 18 and that of the lateral rims 26 and 27, and these three rims diminish in thickness as the cream is used up by each support such as 21. Moreover, the quantity of required cream may be distributed in a periodical and entirely automatic way in that all the cream supplied to the screen is used up by the supports 21, because this quantity which is used up is precisely known.

It will be noted from FIG. 2A that at each extremity the support of the blade 6 slightly passes beyond the corresponding extremity of the blade 8. This allows fixation by way of simple screwing each cheek against each extremity of the blade support by means of screws, such as 28, 29. If the extremity of the blade support is a plane parallel to the directions 15 or 16, as is the case in FIG. 2A, the cheek has a median right face through which the cheek is screwed and two inclined faces at its extremities, the assembly of the cheek assuming the shape of a drawn S and a funnel from front to back with respect to the direction of movement (arrow 16). It would also be possible to give the extremity surfaces of the supports a slight slant from front to back and to fix to each extremity, by way of the confinement cheek, a single plane plate of flexible material, provided that a slight spacing must always be saved between the edge of the blade and the interior wall of the corresponding cheek. However, a plate which is twice bent in the form of an S, as shown in FIG. 2A, is preferred in that the circulation of the cream from front to back takes place in an optimal manner, even where the cream passes beyond the extremity of the blade.

The plate which constitutes each cheek is preferably made of a flexible material, preferably a synthetic material, such as polyvinyl chloride (PVC), with a thickness of between 1 and 4 mm.

A preferred embodiment of the invention is shown in FIG. 3B where only one extremity of the blade 8 with its support 6 and the confinement cheek 25 are shown, while the 3 other extremities are structured similarly, in an identical or symmetrical form.

In FIG. 3B, the extremity of the blade and its support 6 extend in the same vertical plane parallel to the arrows 15 and 16 (not shown). The confinement cheek 25 is substantially the same as that in FIG. 2, but here it is not directly fixed to the support 6 but comprises additional fixation means such as 31. The piece 31 has the form of a T; one of its faces (the lower face) is notched so as to constitute a preferably meandering groove in which the cheek 25 is clamped with one of its long edges. To obtain the preferred S shape as in FIG. 2, the groove may be constituted by parts of 3 straight grooves which overlap each other and are obtained by sawing, such as the straight groove 33 and the slant grooves 34 and 35, or by one meandering groove (not shown) having the desired profile and obtained by milling. These grooves have a depth of approximately 5 mm. In a direction which is substantially perpendicular to that of the grooves, two apertures 36 and 37 are formed in the leg of the T with a view to fixing the piece 31 to the extremity of the support of the blade 6. This fixation is realized by means of a screw (not shown), which goes freely through the aperture 36, and a pin which is associated with the support 6 (not shown in the Figure) going freely through the aperture 37. The way of fixation, identical to another preferred embodiment of the invention, is described below with reference to FIG. 4.

The embodiment shown in FIG. 3 has the advantage that the 4 required pieces 31 can be made from one and the same piece 31 which has symmetries due to its T shape. On the other hand, it has the drawback that it leaves a uselessly large passage of the order of 1 cm for the cream between the blade and the cheek, whereas a smaller spacing of less than 5 mm between these two elements is preferred. The embodiment of FIG. 4 allows a reduction of this spacing to 2 or 3 mm only.

In FIG. 4, the fixation means are constituted by a piece 41 having a substantially parallelopiped shape but being less massive than the piece 31. Its lower face has a meandering groove 42 intended to hold the cheek 43 and give it its shape of the drawn S. However, it will be noted that the groove 42 may also be a straight, though slightly inclined groove so that it occupies essentially the same place as the groove 42. In a direction perpendicular to that of the groove, the piece 41 has two apertures 46, 47 which are similar to the apertures 36 and 37 of FIG. 3A and have the same functions.

For fixing the piece 41 provided with the cheek 43 to the extremity of the support 6, it is prepositioned by means of a pin 48 in the aperture 47, the pin being integral with the support 6, and by means of a combination of a screw and a washer, 49, through the aperture 46 with the relative sizes indicated in the Figure, namely the free edge of the cheek 43 touching the screen 17 while the blade 8 does not yet touch the screen, and the screw 49 being slightly tightened. A force indicated by the arrow 50 may subsequently cause the blade 8 to engage the screen at the nominal angle and pressure. During this movement, the piece 41 is raised with respect to the support 6 and engages the screen 17 with a slight pressure throughout its free edge, i.e. in conformity with the optimal angle of the blade with respect to the screen. It is then tightly fixed by tightening the screw 49. It will be evident that in the case of a modification of the angle between the blade 8 and the screen 17, the positioning of the 4 cheeks should be resumed as described above.

Figure 5A:
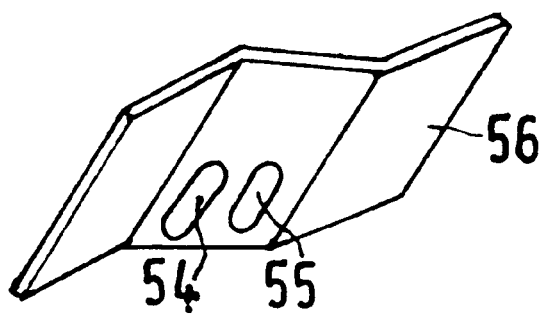
FIGS. 5A and 5B illustrate a third embodiment of the invention, FIG. 5A being a perspective view of the plate consisting of flexible material constituting the cheek, and FIG. 5B being an end view of a mounted cheek.
Figure 5B:
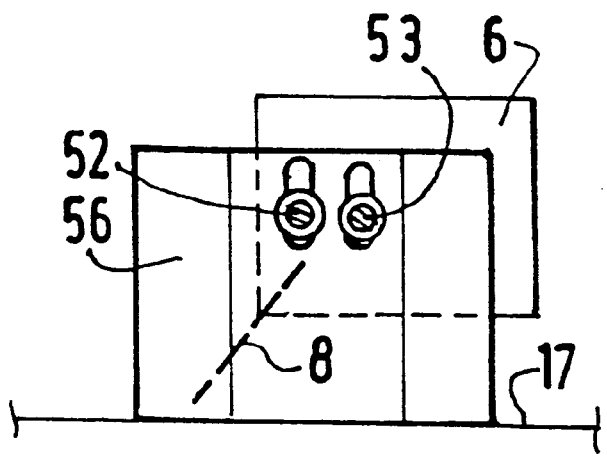

The embodiment shown in FIG. 5 is essentially the same as that shown in FIG. 2. The fixation means in this embodiment are reduced to two screws associated with washers 52 and 53 passing through apertures 54, 55 in the cheek 56. The S shape in FIG. 5A may be obtained, for example by hot-folding a plane plate of flexible PVC. If the edge of the support 6 slightly passes beyond that of the blade 8, as shown in FIG. 2, the plate 56 may be directly fixed against this edge, or otherwise a wedge (not shown) may be interpositioned between the cheek and the edge of the support with a slight tightening of the screws 52 and 53, as described with reference to FIG. 4, for the correct positioning of the cheek 56 carried out in a manner analogous to that for the cheek 41.

To avoid that, as a result of an insufficient engagement of the free edge of the cheek on the screen 17, this cheek leaks the silk-screen printing cream during operation on this free edge and cannot be subsequently taken up again efficiently, it is possible to improve the cheek for all the embodiments described above by giving its free edge a particular shape.

Figures 6A, 6B:
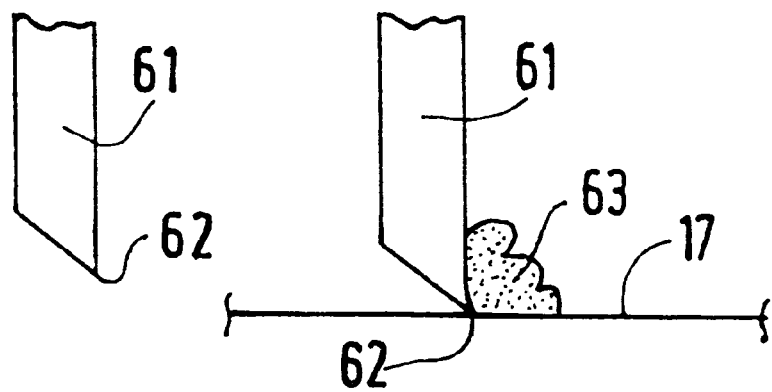
FIGS. 6A and 6B show, partly broken away, the free edge of a chamfered cheek at 6A, and, at 6B, the engagement of this free edge with the silk-screen printing product on the screen.

This improvement, shown in FIG. 6, consists of chamfering the free edge of the cheek 61 from the outside to the inside. Under these conditions, only a ridge 62 situated along the internal face of the plate is in contact with the screen 17 during operation. This ridge is slightly curved inward and acts as a scraper shearing the cream 63, which inhibits the passage of this cream under the edge of the cheek.

The way of positioning a confinement cheek against an extremity of the blade support for a satisfactory performance of the invention has been described above with reference to FIG. 4. For the embodiments shown in FIGS. 3 and 4, an improvement of the invention consists of realizing means for fixing the cheeks such as 31 and 41 in an elastic synthetic material such as an elastomer, i.e. of a natural or synthetic rubber. This provides the advantage that the positioning of the cheeks against the blade supports does not need to be resumed when the angle of engagement of the blades 8, 9 is modified by several (2 or 3) degrees with respect to the screen 17.

The invention is applicable to any automatic silk-screen printing system using two oppositely working scraping blades. However, a preferred application which is adapted to the surface-mounted component technique is that in which the silk-screen printing operation consists of depositing a soldering paste on contact areas on a printed circuit board or a hybrid circuit board. Under these conditions, the soldering paste which constitutes the silk-screen printing product or cream is constituted, for example by small pellets of a Pb-Sn alloy having a diameter of several microns and agglomerated by means of a binder giving this paste thixotropic qualities, and the screen is constituted by a thin leaf of stainless steel having a thickness of 180 $\mu$m or 150 $\mu$m and provided with contact areas on the printed circuit board or the hybrid circuit board to be coated.

What is claimed is:

1. A silk-screen printing system having two scraping blades which are each fixed to a blade support for depositing a silk-screen printing product in accordance with a given configuration on a support to be coated via a screen to be positioned on said support, said screen being perforated in accordance with said configuration, wherein each extremity of the blade support comprises means for fixing a cheek for the silk-screen printing product, said cheek comprising a plate of substantially flexible material which, in operation, engages said screen with its free edge, with a small spacing being provided between the lateral edge of the scraping blade and the plate in the longitudinal direction of the blade, the latter being oriented so as to bring the silk-screen printing product, which passes beyond the extremity of the blade during its passage under pressure on the screen, back to within the screen in the work zone of the blade, and wherein said means for fixing a cheek comprises a cheek support having a groove in which said plate is inserted with a slight grip, said cheek support being fixed by means of screwing to said extremity of the blade support.

2. A silk-screen printing system as claimed in claim 1, characterized in that said cheek support comprises elastic fixation means allowing a satisfactory contact, in operation, between the free edge of said cheek and said screen.

3. A silk-screen printing system as claimed in claim 1, characterized in that said fixation means comprises, for each plate constituting a cheek, of screws associated with washers for directly screwing said plate to said extremity of the blade support.

4. A silk-screen printing system as claimed in claim 1, characterized in that each plate assumes the general shape of a drawn S in a section which is parallel to said screen.

5. A silk-screen printing system as claimed in claim 1, characterized in that the free edge of each plate is chamfered from the outside to the inside of the system, such that only a ridge situated along the internal face of the plate is in contact with the screen during operation.

6. A silk-screen printing system as claimed in claim 1, characterized in that each plate constituting the cheek is made of polyvinyl chloride having a thickness of between 1 and 4 mm.

7. A silk-screen printing system as claimed in claim 1, characterized in that said spacing between each edge of the scraping blade and each plate constituting the cheek is between 1 and 10 mm.

8. A silk-screen printing system as claimed in claim 1, intended to deposit a soldering paste on contact areas of a printed circuit board, in which the screen is constituted by a thin leaf of stainless steel provided with apertures arranged above said contact areas.

* * * * *